United States Patent [19]

Imura et al.

[11] Patent Number: 5,398,212

[45] Date of Patent: Mar. 14, 1995

[54] SEMICONDUCTOR MEMORY DEVICE

[75] Inventors: Koji Imura; Mikiro Okada; Yukimine Shimada, all of Nara, Japan

[73] Assignee: Sharp Kabushiki Kaisha, Osaka, Japan

[21] Appl. No.: 220,188

[22] Filed: Mar. 30, 1994

[30] Foreign Application Priority Data

Sep. 9, 1993 [JP] Japan .................. 5-224739

[51] Int. Cl.$^6$ .......................... G11C 8/00; G06F 9/46
[52] U.S. Cl. .................. 365/230.08; 395/400; 395/425; 365/230.03
[58] Field of Search ............ 365/230.08, 230.03, 365/235, 241; 395/400, 425

[56] References Cited

U.S. PATENT DOCUMENTS

| | | | |
|---|---|---|---|
| 4,434,464 | 2/1984 | Suzuki et al. | 395/425 |
| 5,042,003 | 8/1991 | Belt et al. | 395/425 |

FOREIGN PATENT DOCUMENTS 3-58376  3/1991  Japan .

*Primary Examiner*—Eugene R. LaRoche
*Assistant Examiner*—Tan Nguyen
*Attorney, Agent, or Firm*—Morrison & Foerster

[57] ABSTRACT

A semiconductor memory device according to the present invention includes: a memory cell array including $(2^n+m)$ memory cells, wherein n and m are integers satisfying the relationship $2^n<2^n+m<2^{n+1}$; an address decoder for receiving an address signal of (n+1) bits and for specifying one of the $(2^n+m)$ memory cells in accordance with the address signal; an output circuit for outputting data stored in the memory cell specified by the decoding means; an empty address detecting circuit for receiving at least two bits of the address signal of (n+1) bits and for generating a detection signal which indicates whether the address signal represents an empty address or not; and a control circuit for receiving an enable signal and for generating a control signal for outputting the data stored in the specified memory cell in accordance with the enable signal, wherein the control circuit further receives the detection signal and generates a control signal for inhibiting the data from being output when the address signal specifies an empty address, regardless of the state of the enable signal.

6 Claims, 17 Drawing Sheets

PRIOR ART

SEMICONDUCTOR MEMORY DEVICE

BACKGROUND OF THE INVENTION

1. Field of the Invention

The present invention relates to as emiconductor memory device having an optimized storage capacity.

2. Description of the Related Art

A conventional semiconductor memory device has an address space of $2^n$ bits. Specifically, the address space has addresses from 0 to $2^n-1$, and one of the addresses from 0 to $2^n-1$ is to be specified by using an address signal of n bits. If each address in the address space corresponds to one bit of information, the semiconductor memory device has a storage capacity of $2^n$ bits. A DRAM (Dynamic Random Access Memory), which is often used as a large capacity memory, is typically configured in such a manner that each address corresponds to one bit of information.

In some cases, one may desire a semiconductor memory device having a storage capacity of $3 \times 2^{n-1}$ bits obtained by adding $2^n$ bits to $2^{n-1}$ bits which is half of $2^n$ bits. Conventionally, such a semiconductor memory device has been implemented by either of the following methods: (1) combining a semiconductor memory device having a storage capacity of $2^n$ bits with a semiconductor memory device having a storage capacity of $2^{n-1}$, and (2) using a single semiconductor memory device having a storage capacity of $2^{n+1}$. Since method (1) can be realized at lower costs than method (2), method (1) is more likely to be used in cases where costs are regarded as an important factor.

FIG. 12 shows a configuration for a conventional semiconductor memory device in which a semiconductor memory device 31 having a storage capacity of $2^n$ bits and a semiconductor memory device 32 having a storage capacity of $2^{n-1}$ bits are combined. The semiconductor memory device 31 receives an address signal of n bits ($A_0$ to $A_{n-1}$). The semiconductor memory device 32 receives an address signal of (n-1) bits ($A_0$ to $A_{n-2}$). A chip enable signal $\overline{CE1}$ and a chip enable signal $\overline{CE2}$ are controlled in such a manner that only one of them is active at a time. When $\overline{CE1}$ is active, the semiconductor memory device 31 is selected. As a result, data ($D_0$ to $D_7$) is read out from the semiconductor memory device 31 in accordance with the address signal of $A_0$ to $A_{n-1}$. When $\overline{CE2}$ is active, the semiconductor memory device 32 is selected. As a result, data ($D_0$ to $D_7$) is read out from the semiconductor memory device 32 in accordance with the address signal of $A_0$ to $A_{n-2}$.

FIG. 13 shows a configuration for a semiconductor memory device which is composed of a single semiconductor memory device 33 having a storage capacity of $2^{n+1}$ bits. An address signal of (n+1) bits and a chip enable signal $\overline{CE}$ are input to the semiconductor memory device 33. When the chip enable signal $\overline{CE}$ is active, data ($D_0$ to $D_7$) is read out from the semiconductor memory device 33 in accordance with the address signal of $A_0$ to $A_n$.

The semiconductor memory devices 31 and 32 each have a plurality of signal terminals for receiving the address signals. The number of the signal terminals of each of the semiconductor memory devices 31 and 32 and the arrangement of the signal terminals are often different from the number signal terminals and terminal arrangement of a semiconductor memory device having a storage capacity of $2^{n+1}$ bits. This is because a different number of bits for an address signal to be input to a semiconductor memory device requires a different design of the semiconductor memory device, in general. Therefore, if a storage capacity of $2^{n+1}$ bits becomes necessary later, it is difficult to replace the semiconductor memory devices 31 and 32 with a semiconductor memory device having a storage capacity of $2^{n+1}$ bits. Thus, a conventional semiconductor memory device has the problem of poor expandability of storage capacity.

The semiconductor memory device shown in FIG. 13 has the advantages that (1) the circuitry used therein is of a simple configuration, and (2) the storage capacity can be expanded up to $2^{n+1}$ bits without particularly changing the circuitry configuration. However, the semiconductor memory device shown in FIG. 13 has the problem of increased costs, since it utilizes a semiconductor memory device having a maximum storage capacity larger than the storage capacity which is actually required.

Hereinafter, the increase in cost of a semiconductor memory device in the case where the storage capacity thereof is to be increased to be twice as large will be described.

FIG. 16A schematically shows the respective sizes of a 1M bit memory chip and a 2M bit memory chip. FIG. 16B schematically shows the respective sizes of a 16M bit memory chip and a 32M bit memory chip.

As is shown in FIG. 16A, the size of the memory chip mainly depends on the size of the peripheral circuitry when the storage capacity of the semiconductor memory device is relatively small. The size of the peripheral circuitry does not change drastically even if the number of the memory cells is doubled. Accordingly, the size of the memory chip does not change drastically even if the number of the memory cells is doubled. On the other hand, as is shown in FIG. 16B, the size of a memory chip having a relatively large storage capacity mainly depends on the number of the memory cells. Accordingly, the size of the memory chip increases substantially in proportion to the number of the memory cells. As a result, if the storage capacity of the semiconductor memory device is doubled, an area occupied by the memory chip is also substantially doubled, thereby substantially doubling the manufacturing costs of the memory chip. It is extremely important for a semiconductor memory device to be fabricated at low costs to have superiority over other semiconductor memory devices on the semiconductor memory device market. Accordingly, the semiconductor memory device shown in FIG. 13 is not desirable in terms of the fabrication costs.

The present invention, therefore, aims at providing a semiconductor memory device having an optimized storage capacity and an excellent expandability of storage capacity. Herein, the expression 'optimized storage capacity' is defined as a storage capacity which is optimum in terms of the cost aspect as described above.

FIG. 17 illustrates yearly transitions of the costs of 8M bit memories, 16M bit memories, and 32M bit memories. It will be understood that the costs required for each class of memories are reduced every year, but that the costs for a 32M bit memory are still approximately twice as large as those for a 16M bit memory. This indicates that there may exist a potential need for, in the case where a storage capacity larger than 16M bits is required, a smaller storage capacity than 32M bits, such as 24M bits, because of the cost problem as described above.

SUMMARY OF THE INVENTION

A semiconductor memory device according to the present invention includes: a memory cell array including $(2^n+m)$ memory cells, wherein n and m are integers satisfying the relationship $2^n<2^n+m<2^{n+1}$; decoding means for receiving an address signal of $(n+1)$ bits and for specifying one of the $(2^n+m)$ memory cells in accordance with the address signal; output means for outputting data stored in the memory cell specified by the decoding means; empty address detecting means for receiving at least two bits of the address signal of $(n+1)$ bits and for generating a detection signal which indicates whether the address signal represents an empty address or not; and control means for receiving an enable signal and for generating a control signal for outputting the data stored in the specified memory cell in accordance with the enable signal, wherein the control means further receives the detection signal and generates a control signal for inhibiting the data from being output when the address signal specifies an empty address, regardless of the state of the enable signal.

In one embodiment of the invention, a terminal arrangement of the semiconductor memory device is substantially identical with that of a semiconductor memory device having an address space of $2^{n+1}$ bits.

In another embodiment of the invention, the internal state of the semiconductor memory device is the standby state when the control signal is a signal for inhibiting the data from being output.

In still another embodiment of the invention, the output means receives the control signal from the control means and places a terminal of the output means into a high-impedance state when the control signal is a signal for inhibiting the data from being output.

Alternatively, a semiconductor memory device according to the present invention includes: a memory cell array including $(2^n+m)$ memory cells, wherein n and m are integers satisfying the relationship $2^n<2^n+m<2^{n+1}$; top address storing means for storing a top address signal of $(n+1)$ bits; address converting means for receiving an address signal of $(n+1)$ bits and the top address signal and for converting the address signal into an internal address signal of $(n+1)$ bits in accordance with the top address signal; decoding means for receiving the internal address signal and for specifying one of the $(2^n+m)$ memory cells in accordance with the internal address signal; output means for outputting data stored in the memory cell specified by the decoding means; empty address detecting means for receiving at least two bits of the internal address signal of $(n+1)$ bits and for generating a detection signal which indicates whether the address signal represents an empty address or not; and control means for receiving an enable signal and for generating a control signal for outputting the data stored in the specified memory cell in accordance with the enable signal, wherein the control means further receives the detection signal and generates a control signal for inhibiting the data from being output when the address signal specifies an empty address, regardless of the state of the enable signal.

Alternatively, a semiconductor memory device according to the present invention includes: a memory cell array including $(2^n+m)$ memory cells, wherein n and m are integers satisfying the relationship $2^n<2^n+m<2^{n+1}$; address converting means for receiving an address signal of $(n+1)$ bits and for outputting an address signal for accessing one of the $(2^n+m)$ memory cells in accordance with the address signal; decoding means for receiving the address signal from the address converting means and for specifying one of the $(2^n+m)$ memory cells in accordance with the address signal; output means for outputting data stored in the memory cell specified by the decoding means; and empty address detecting means for receiving at least two bits of the address signal of $(n+1)$ bits and for generating a detection signal which indicates whether the address signal represents an empty address or not, wherein the address converting means converts the received address signal into an address signal for allowing access to one of the $(2^n+m)$ memory cells when the address signal represents an empty address.

Alternatively, a semiconductor memory device according to the present invention includes an intermediate capacity of $(2^n+m)$ bits as an internal storage address space, wherein the number of addresses input to the semiconductor memory device is $(n+1)$, and wherein a relationship of $2^n<2^n+m<2^{n+1}$ is satisfied, n and m being integers.

Thus, the invention described herein makes possible an advantage of providing a relatively cheap semiconductor memory device having an intermediate storage capacity, while securing the freedom to replace the semiconductor memory device with a larger storage capacity in the future.

This and other advantages of the present invention will become apparent to those skilled in the art upon reading and understanding the following detailed description with reference to the accompanying figures.

DESCRIPTION OF THE PREFERRED EMBODIMENTS

The present invention is applicable to various semiconductor memory devices, such as mask ROMs (Read-Only Memories), DRAMs (Dynamic Random Access Memories), SRAMs (Static RAMs), EPROM (Erasable Programmable ROMs), EEPROMs (Electrically EPROMs), and flash EEPROMs.

Hereinafter, the present invention will be described by way of examples, with reference to the accompanying drawings.

EXAMPLE 1

Figure 1:
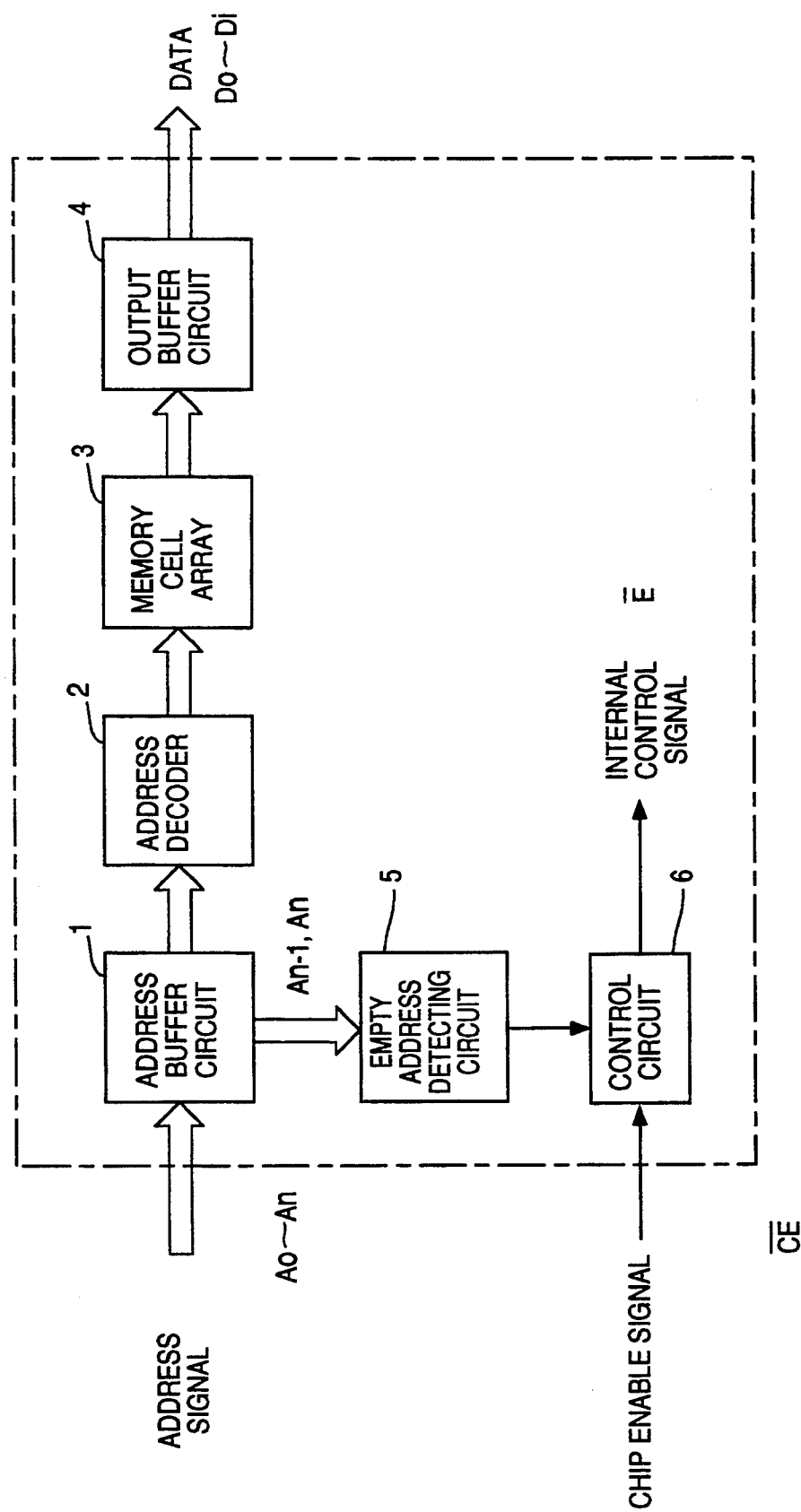
FIG. 1 is a block diagram showing a configuration for a semiconductor memory device according to a first example of the present invention.

FIG. 1 shows a configuration for a semiconductor memory device according to a first example of the present invention.

The semiconductor memory device according to the present example has an address space of $(2^n+m)$ bits. Each address in the address space corresponds to a memory cell of $(i+1)$ bits (wherein i is an integer of 0 or more). Accordingly, the semiconductor memory device has a storage capacity of $(2^n+m) \times (i+1)$ bits. Herein, m is a positive integer smaller than $2^n$. For the sake of explanation, only a configuration for the semiconductor memory device relating to reading operations of data will be described below. However, a configuration for a semiconductor memory device relating to writing operations of data can be obtained in the same manner.

The semiconductor memory device shown in FIG. 1 includes a memory cell array 3 having $(2^n+m)$ memory cells. Herein, n and m are integers satisfying the relationship $2^n < 2^n + m < 2^{n+1}$. An address buffer circuit 1 and an address decoder 2 function to specify one of the memory cells included in the memory cell array 3 in accordance with an address signal of $(n+1)$ bits ($A_0$ to $A_n$). The address buffer circuit 1 is an input interface circuit for converting the address signal of $A_0$ to $A_n$ on an address bus (not shown) into an address signal for an internal logic level. The converted address signal is supplied to the address decoder 2. The address decoder 2 decodes the address signal, and selects one of the memory cells included in the memory cell array 3. Data for $D_0$ to $D_i$ which is stored in the selected memory cell is amplified by a sense amplifier (not shown) and thereafter is output through an output buffer circuit 4. The output buffer circuit 4 is an output interface circuit for outputting the data of $D_0$ to $D_i$ which is read out from the memory cell array 3 to a data bus (not shown).

The semiconductor memory device shown in FIG. 1 further includes an empty address detecting circuit 5 and a control circuit 6. The empty address detecting circuit 5 receives at least the two most significant bits (MSB), i.e. $A_{n-1}$ and $A_n$, of the address signal of $A_0$ to $A_n$, and generates a detection signal indicating whether the address signal specifies an empty address or not. For example, the empty address detecting circuit 5 generates a detection signal which becomes active when the two most significant bits $A_{n-1}$ and $A_n$ are both '1' (i.e. high level). This detection signal is supplied to the control circuit 6. Herein, an 'empty address' is defined as an address which does not exist in an accessible portion of the address space. For example, if the access space consists of $(2^n+m)$ addresses and the addresses from 0 to $2^n+m-1$ are accessible, the remaining addresses from $2^n+m$ to $2^{n+1}-1$ are empty addresses.

Figure 2:
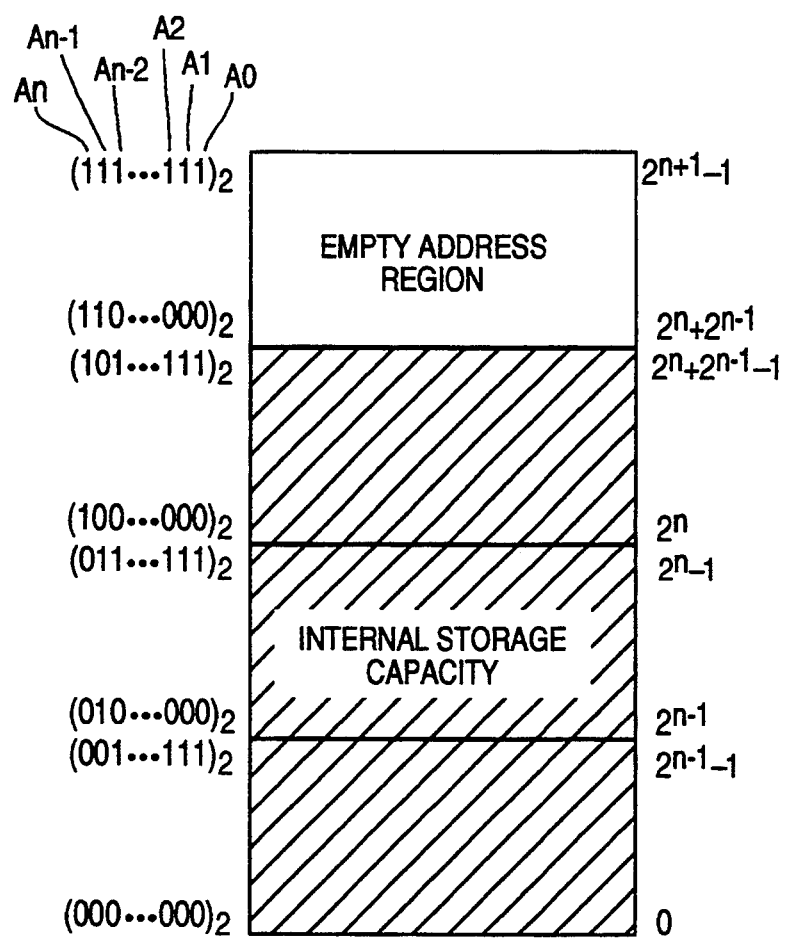
FIG. 2 is a diagram showing an arrangement of the address space of the semiconductor memory device according to a first example of the present invention.

FIG. 2 shows an arrangement for an address space of the semiconductor memory device in the case where $m=2^{n-1}$. This semiconductor memory device has a storage capacity of $(2^n+2^{n-1}) \times (i+1)$ bits. This capacity is equivalent to three fourths of $2^{n+1}$, which is the maximum allowable capacity. In this exemplary semiconductor memory device, the addresses from 0 (or $(000 \ldots 000)_2$, as expressed by the binary system) to $2^n+2^{n-1}-1$ (or $(101 \ldots 111)_2$) in the address space are accessible, and correspond to the respective memory cells of the memory cell array 3. On the other hand, the addresses whose two most significant bits $A_{n-1}$ and $A_n$ are both '1', namely the address $2^n+2^{n-1}$ (or $(110 \ldots 000)_2$, as expressed by the binary system) to $2^{n+1}-1$ (or $(111 \ldots 111)_2$) in the address space, are inhibited from being accessed. These addresses are empty addresses, to which no memory cells correspond.

The control circuit 6 receives a chip enable signal $\overline{CE}$, and generates a control signal for outputting data which is stored in a specified memory cell in accordance with the received chip enable signal $\overline{CE}$. However, if the address signal specifies an empty address, the control 6 generates a control signal for inhibiting the data from being output regardless of the state of the chip enable signal $\overline{CE}$. For example, the control circuit 6 generates an internal control signal $\overline{E}$ which becomes active when the chip enable signal $\overline{CE}$ is active. If the detection signal from the empty address erecting circuit 5 is active, the internal control signal E becomes inactive regardless of the state of the chip enable signal $\overline{CE}$. When the state of the internal control signal $\overline{E}$ changes from inactive to active, a precharge circuit (not shown) for precharging a bit line pair of the memory cell array 3 and a sense amplifier (not shown) operate. Thus, a data reading operation of the data starts. If the internal control signal $\overline{E}$ is inactive, no data reading operation of data is performed, that is, the semiconductor memory device is in a stand-by state (i.e. a waiting state for reading out data).

Alternatively, the control circuit 6 may be programmed to access a non-empty address when the address signal specifies an empty address.

TABLE 1

| $\overline{CE}$ | $A_{n-1}$ | $A_n$ | $\overline{E}$ | Internal state |
|---|---|---|---|---|
| 0 | 0 | 0 | 0 | Active |
|   | 1 | 0 |   |   |
|   | 0 | 1 |   |   |
|   | 1 | 1 | 1 | Stand-by |
| 1 | X | X | 1 |   |

Table 1 is a truth table showing the relationships between the chip enable signal $\overline{CE}$, the two most significant bits, i.e. $A_{n-1}$ and $A_n$, of the address signal of $A_0$ to $A_n$, and the internal control signal $\overline{E}$. Each 'x' mark in the table denotes an arbitrary value. As is seen from Table 1, the internal control signal $\overline{E}$ is always at '1' (i.e. inactive) when the chip enable signal $\overline{CE}$ is at '1' (i.e. inactive), so that the semiconductor memory device is in a stand-by state. When the chip enable signal $\overline{CE}$ is at '0' (i.e. active), the internal signal $\overline{E}$ is at '1' (i.e. inactive) only if the two most significant bits $A_{n-1}$ and $A_n$ of the address signal are both at '1'. The semiconductor memory device is also in a stand-by state under this condition. On the other hand, if the values of the two most significant bits $A_{n-1}$ and $A_n$ of the address signal are of any other combination than '1'-'1', the internal control signal $\overline{E}$ is at '0' (i.e. active), so that the internal state of the semiconductor memory device becomes active.

Figure 3:
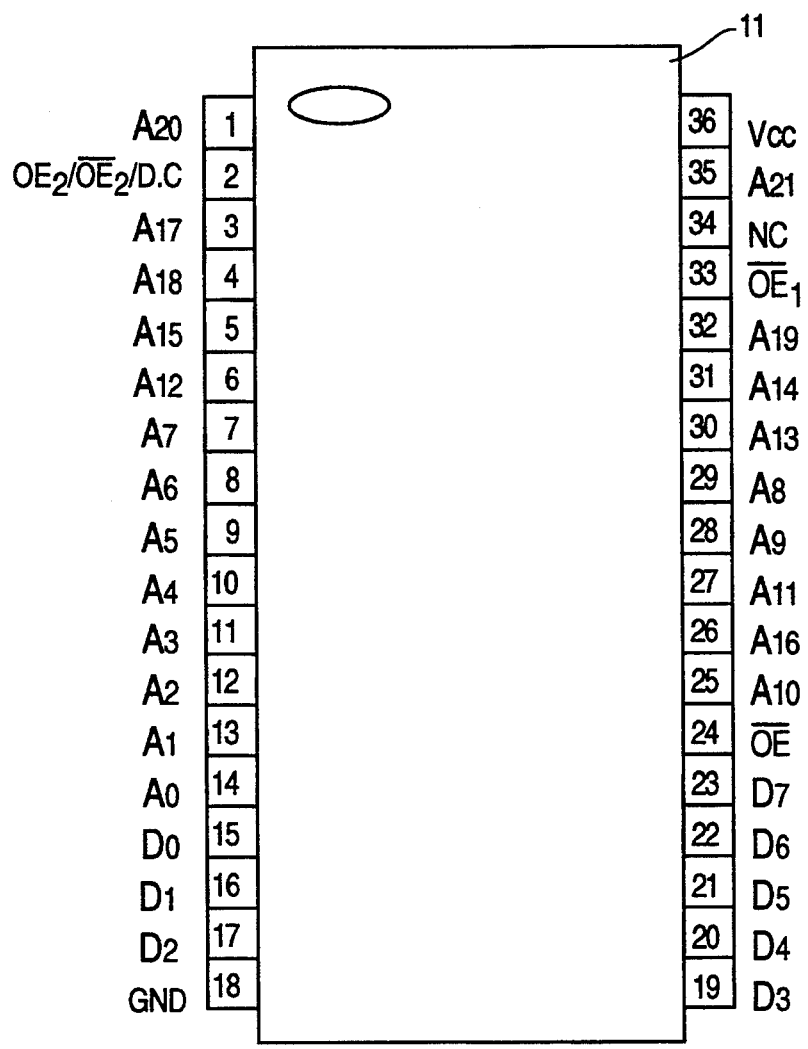
FIG. 3 is a plan view showing a semiconductor memory device according to a first example of the present invention.

FIG. 3 shows an exemplary arrangement of terminals of the semiconductor memory device 11 according to the present example, in the case where n=21 and i=7. Specifically, the semiconductor memory device 11 receives an address signal of 22 bits ($A_0$ to $A_{21}$), and each address corresponds to a memory cell capable of storing data of 8 bits. The semiconductor memory device 11 has 22 address signal terminals for inputting the 22-bit address signal of $A_0$ to $A_{21}$, and 8 data output terminals for outputting the 8-bit data of $D_0$ to $D_7$.

Figure 4A:
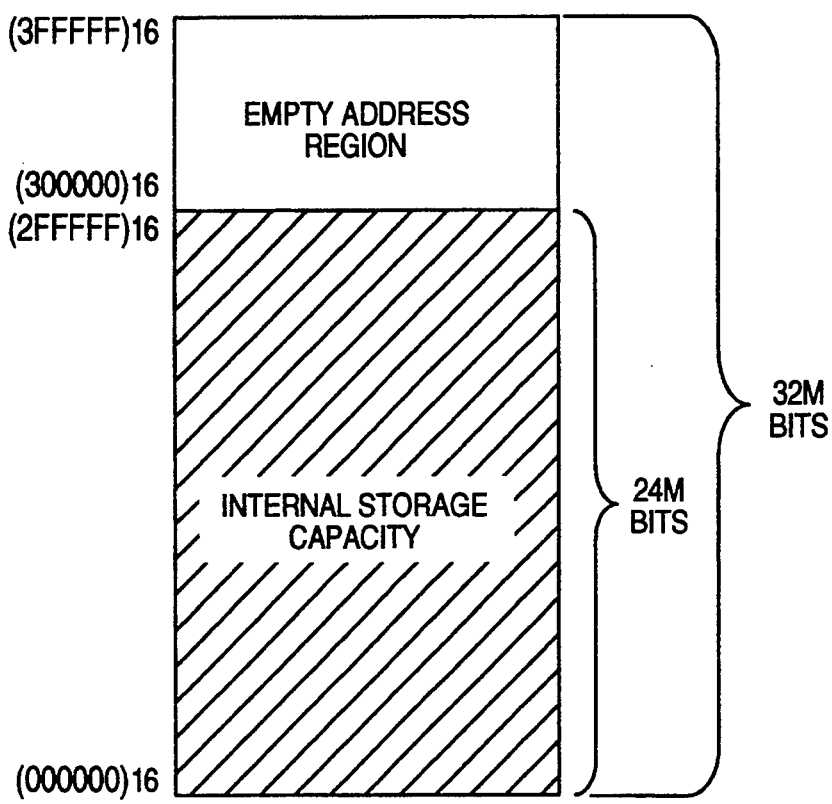
FIGS. 4A to 4C are diagrams each showing an arrangement of the address space of the semiconductor memory device according to a first example of the present invention.

As is shown in FIG. 4A, the semiconductor memory device 11 has a storage capacity of 24M bits (as derived from a calculation $2^{21}+2^{20} \times 8$ bits). This capacity is equivalent to three fourths of 32M bits (as derived from a calculation $2^{22} \times 8$ bits), which is the maximum mountable capacity. In the address space of the semiconductor memory device 11, the addresses from 0 (or $(000000)_{16}$, as expressed by the hexadecimal system) to 3145727 (or $(2FFFFF)_{16}$) correspond to the respective memory cells in the memory cell array 3. On the other hand, the addresses from 3145728 (or $(300000)_{16}$) to 4194303 (or $(3FFFFF)_{16}$) in the address space are empty addresses, to which no memory cells correspond.

Figure 4B:
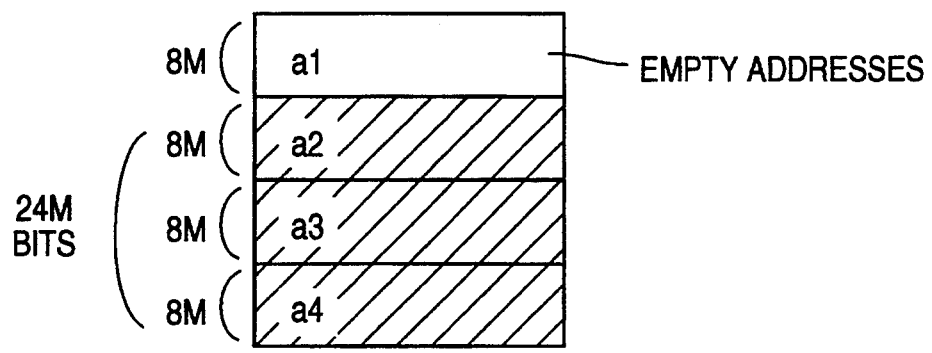
Figure 4C:
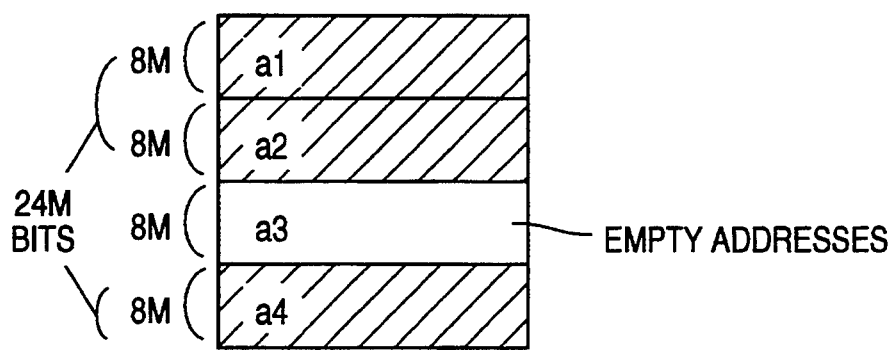

FIGS. 4B and 4C show exemplary assignments of empty addresses. In each of FIGS. 4B and 4C, an address space of 32M bits is divided into four sub-address spaces, namely a1, a2, a3, and a4, each consisting of 8M bits. In the exemplary assignment shown in FIG. 4B, the first sub-address space a1 is assigned with an empty address. In the exemplary assignment shown in FIG. 4C, the third sub-address space a3 is assigned with an empty address. As will be appreciated, it is possible to assign an empty address to any portion of the address space. Typically, the two most significant bits of each address signal are used to specify an empty address. However, the present invention does not provide any limitations thereto. For example, in an extreme case, the two least significant bits (LSB) are used for specifying an empty address. In such cases, non-empty addresses and empty address are disposed side by side in the address space, so that every other address, separated by 1 bit, is an empty address.

The semiconductor memory device 11 includes the same number of address terminals as those of a semiconductor memory device having a storage capacity of 32M bits. Accordingly, the exact same terminal arrangement for 32M bit semiconductor memory devices can be used for the semiconductor memory device 11. Thus, it is made easy to replace the 24M bit memory device with a 32M bit memory in the future. In general, a semiconductor memory device according to the present invention corresponds to an address space of (n+1) bits. Therefore, it follows that it is possible to replace a ($2^n$+m) bit memory device with a $2^{n+1}$ bit memory device, according to the present invention. In contrast, in the prior art, a $2^n$ bit memory and a $2^{n+1}$ bit memory have different address terminal arrangements ('pin arrangements'). Therefore, according to the prior art, it is impossible to replace a $2^n$ bit memory device with a $2^{n+1}$ bit memory device.

As has been described, according to the semiconductor memory device of the present example, the terminal arrangement thereof can be made identical with that of a semiconductor memory device having a larger storage capacity, and the storage capacity thereof can be optimized. As a result, the problem of excess storage capacity is eliminated, thereby making it possible to provide a low-cost semiconductor memory device whose power consumption is relatively small. In addition, the expandability of the storage capacity the semiconductor memory device is improved. This makes it possible to easily replace the semiconductor memory device(s) in a memory system.

EXAMPLE 2

Figure 5:
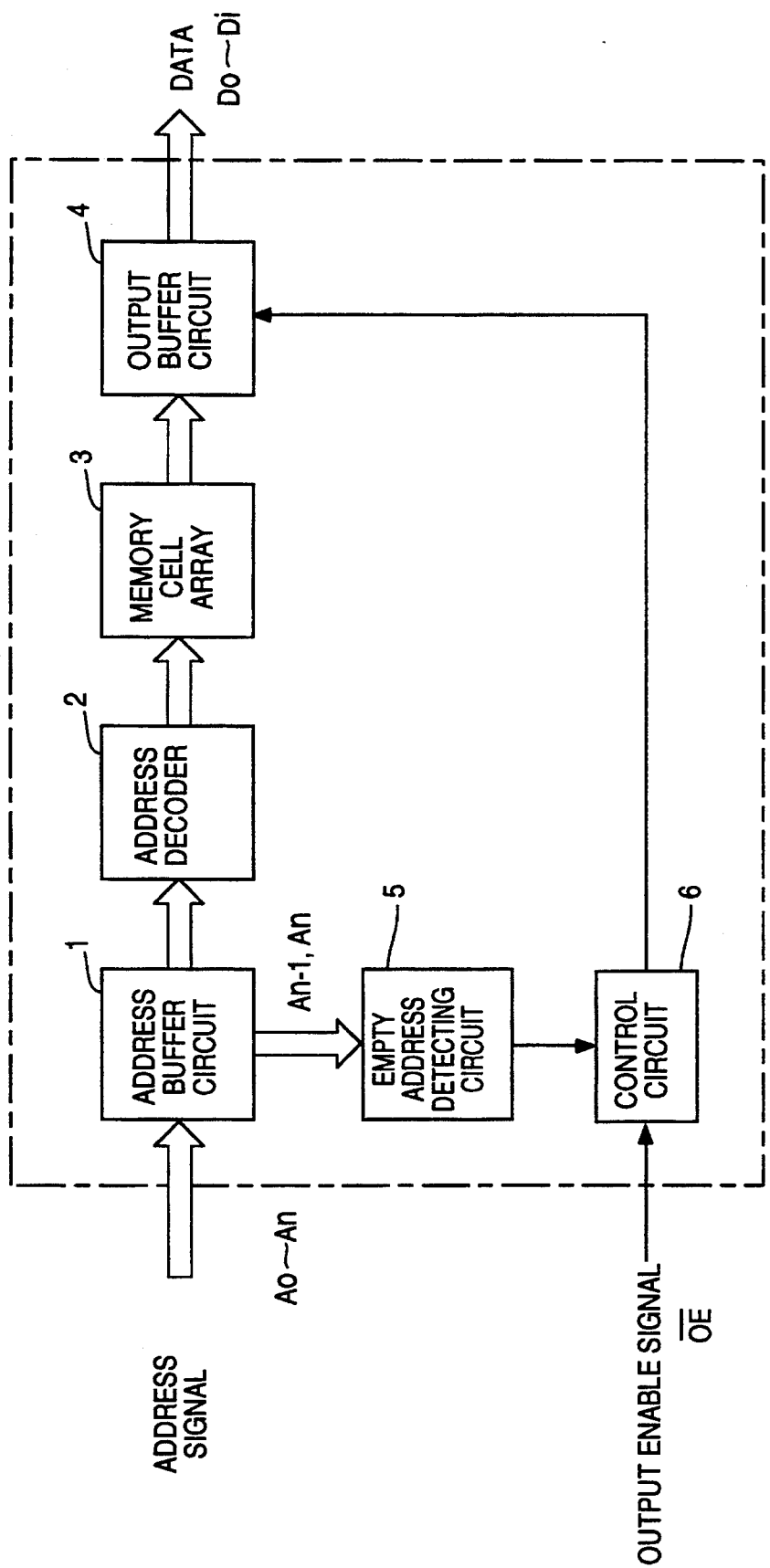
FIG. 5 is a block diagram showing a configuration for a semiconductor memory device according to a second example of the present invention.

FIG. 5 shows a configuration for a semiconductor memory device according to a second example of the present invention. Component elements having similar functions to the component elements of the semiconductor memory device of the first example (shown in FIG. 1) are indicated by the same reference numerals, and descriptions thereof are omitted.

A control circuit 6 receives an output enable signal $\overline{OE}$ instead of a chip enable signal $\overline{CE}$. The output enable signal $\overline{OE}$ is a signal for permitting data which is read out from a memory cell to be output to a data bus. The control circuit 6 supplies a signal, which becomes active when the output enable signal $\overline{OE}$ is active, to an output buffer circuit 4. However, as in the first example of the invention, this signal from the control circuit 6 becomes inactive whenever a detection signal from an empty address detecting circuit 5 is active, regardless of the state of the output enable signal $\overline{OE}$. If the signal from the control circuit 6 is active, the output buffer circuit 4 outputs data of $D_0$ to $D_i$ which is read out from a memory cell of a memory cell array 3, to the data bus. If the signal from the control circuit 6 is inactive, the output buffer circuit 4 places an output terminal thereof in a high-impedance state. As a result, the data of $D_0$ to D. that is read out from the memory cell is inhibited from being output.

TABLE 2

| $\overline{OE}$ | $A_{n-1}$ | $A_n$ | Output of control circuit 6 | Output buffer circuit 4 |
|---|---|---|---|---|
| 0 | 0 | 0 | 0 | Active |
| | 1 | 0 | 0 | |
| | 0 | 1 | 0 | |
| | 1 | 1 | 1 | High-impedance |
| 1 | X | X | 1 | |

Table 2 is a truth table showing the relationships between the output enable signal $\overline{OE}$, the two most significant bits i.e. $A_{n-1}$ and $A_n$, of the address signal of $A_0$ to $A_n$, and the signal from the control circuit 6. Each 'x' mark in the table denotes an arbitrary value. As is seen from Table 2, the signal from the control circuit 6 is always at '1' (i.e. inactive) when the output enable signal $\overline{OE}$ is at '1' (i.e. inactive). As a result, the output terminal of the output buffer circuit 4 is put in a high-impedance state whereby the data of $D_0$ to $D_i$ is inhibited from being output. When the output enable signal $\overline{OE}$ is at '0' (i.e. active), the signal from the control circuit 6 is at '1' (i.e. inactive) only if the two most significant bits $A_{n-1}$ and $A_n$ of the address signal are both at '1'. As a result, the output terminal of the output buffer circuit 4 is put in a high-impedance state, whereby the data of $D_0$ to $D_i$ is inhibited from being output. On the other hand, if the values of the two most significant bits $A_{n-1}$ and $A_n$ of the address signal are of any other combination than '1'-'1', the signal from the control circuit 6 is at '0' (i.e. active), so that the output buffer circuit 4 outputs the data of $D_0$ to $D_i$ to the data bus.

As has been described, according to the semiconductor memory device of the present example, the storage capacity thereof can be optimized in the same manner as in the first example of the invention. This makes it possible to provide a low-cost semiconductor memory device whose power consumption is relatively small. In addition, the expandability of the storage capacity the semiconductor memory device is improved. This makes it possible to easily replace the semiconductor memory device(s) in a memory system.

EXAMPLE 3

Figure 6:
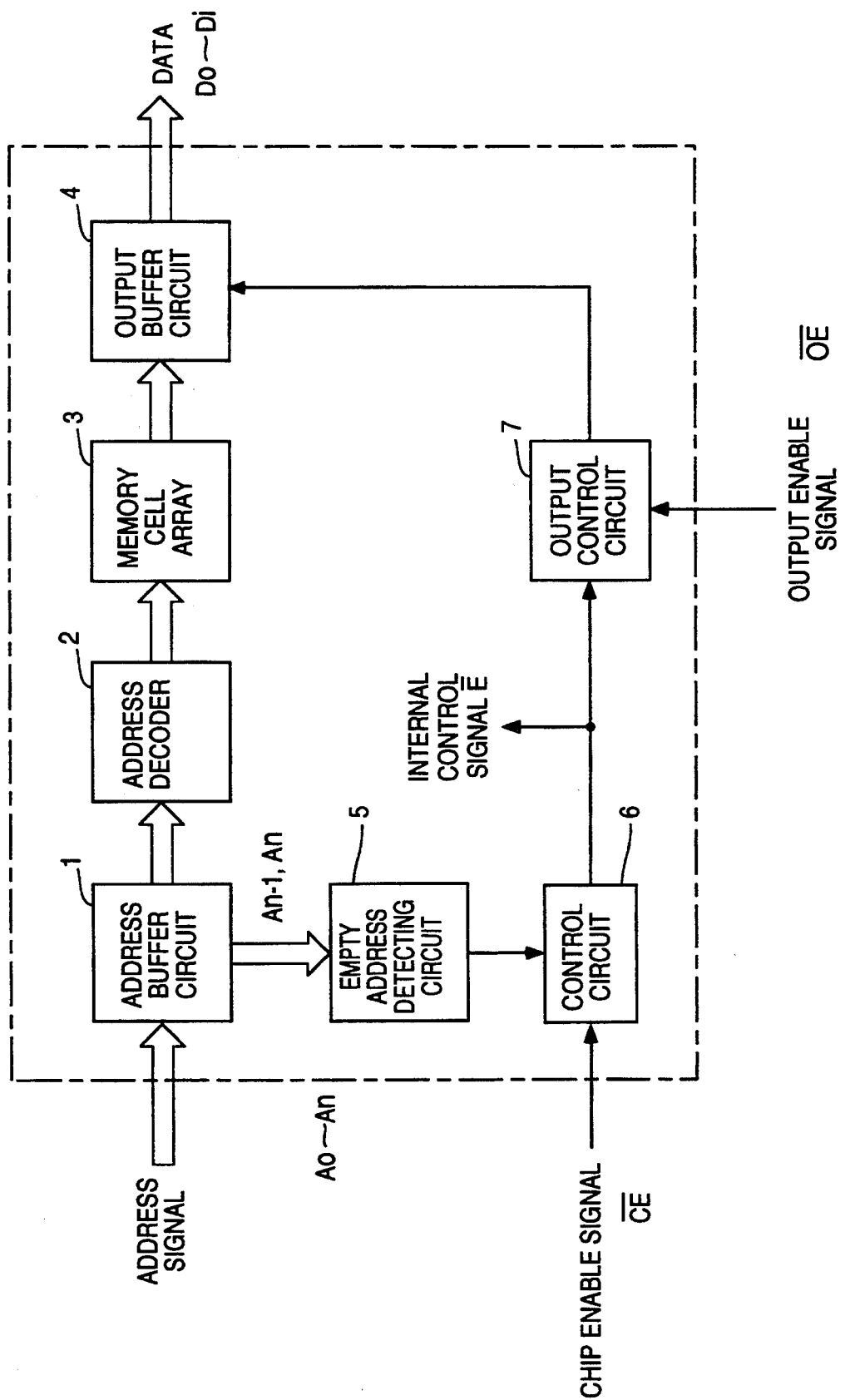
FIG. 6 is a block diagram showing a configuration for a semiconductor memory device according to a third example of the present invention.

FIG. 6 shows a configuration for a semiconductor memory device according to a third example of the present invention. Component elements having similar functions to the component elements of the semiconductor memory device of the first example (shown in FIG. 1) are indicated by the same reference numerals, and descriptions thereof are omitted.

The semiconductor memory device shown in FIG. 6 includes an output control circuit 7, in addition to an address buffer circuit 1, an address decoder 2, a memory cell array 3, an output buffer circuit 4, an empty address detecting circuit 5, and a control circuit 6.

The output control circuit 7 receives an internal control signal $\overline{E}$ and an output enable signal $\overline{OE}$. The output control circuit 7 supplies a signal, which becomes active when the output enable signal $\overline{OE}$ is active, to the output buffer circuit 4. However, as in the first example of the invention, the output signal from the output control circuit 7 becomes inactive whenever the internal control signal $\overline{E}$ is inactive, regardless of the state of the output enable signal $\overline{OE}$. If the signal from the output control circuit 7 is active, the output buffer circuit 4 outputs data of $D_0$ to $D_i$ which is read out from a memory cell of the memory cell array 3 to the data bus. If the output signal from the output control circuit 7 is inactive, the output buffer circuit 4 places an output terminal thereof in a high-impedance state. As a result the data of $D_0$ to $D_i$ which is read out from the memory cell is inhibited from being output.

TABLE 3

| $\overline{CE}$ | $\overline{OE}$ | $A_{n-1}$ | $A_n$ | Output buffer circuit 4 | Internal state |
|---|---|---|---|---|---|
| 0 | 0 | 0 | 0 | Active | Active |
|   |   | 1 | 0 |   |   |
|   |   | 0 | 1 |   |   |
|   |   | 1 | 1 | High-impedance |   |
|   | 1 | X | X |   |   |
| 1 | X | X | X |   | Stand-by |

Table 3 is a truth table showing the relationships between the chip enable signal $\overline{CE}$, the output enable signal $\overline{OE}$, and the two most significant bits, i.e. $A_{n-1}$ and $A_n$, of the address signal of $A_0$ to $A_n$. Each 'x' mark in the table denotes an arbitrary value. As is seen from Table 3, the internal state of the semiconductor memory device is always in a stand-by state when the chip enable signal $\overline{CE}$ is at '1' (i.e. inactive). As a result, the output terminal of the output buffer circuit 4 is put in a high-impedance state. If the chip enable signal $\overline{CE}$ is at '0' (i.e. active), the internal state of the semiconductor memory device is always active, so that a reading operation of the data is performed. However, the output terminal of the output buffer circuit 4 is always in a high-impedance state when the output enable signal $\overline{OE}$ is at '1' (i.e. inactive), even if the internal state of the semiconductor memory device is active. When the chip enable signal $\overline{CE}$ and the output enable signal $\overline{OE}$ are both at '0' (i.e. active), the output terminal of the output control circuit 7 is in a high-impedance state only if the two most significant bits $A_{n-1}$ and $A_n$ of the address signal are both at '1'. On the other hand, if the values of the two most significant bits $A_{n-1}$ and $A_n$ of the address signal are of other combination than '1'-'1', the output buffer circuit 4 outputs the data of $D_0$ to $D_i$.

As has been described, according to the semiconductor memory device of the present example, the storage capacity thereof can be optimized in the same manner as in the first example of the invention. This makes it possible to provide a low-cost semiconductor memory device whose power consumption is relatively small. In addition, the expandability of the storage capacity the semiconductor memory device is improved. This makes it possible to easily replace the semiconductor memory device(s) in a memory system.

EXAMPLE 4

Figure 7:
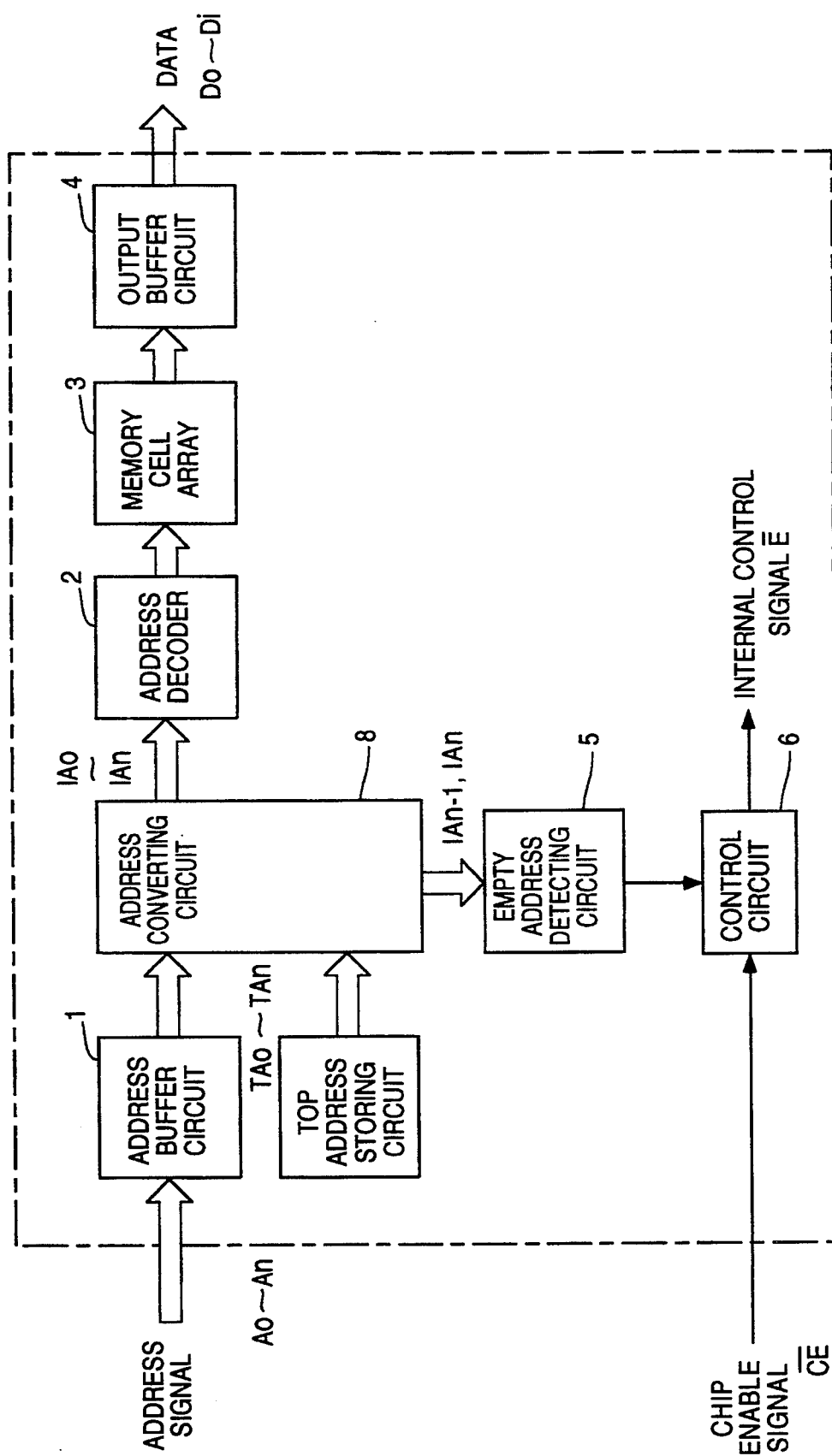
FIG. 7 is a block diagram showing a configuration for a semiconductor memory device according to a fourth example of the present invention.

FIG. 7 shows a configuration for a semiconductor memory device according to a fourth example of the present invention. Component elements having similar functions to the component elements of the semiconductor memory device of the first example (shown in FIG. 1 ) are indicated by the same reference numerals, and descriptions thereof are omitted.

The semiconductor memory device according to the present example includes an address converting circuit 8 and a top address storing circuit 9, in addition to an address buffer circuit 1, an address decoder 2, a memory cell array 3, an output buffer circuit 4, an empty address detecting circuit 5, and a control circuit 6.

The address converting circuit 8 receives an address signal of $A_0$ to $A_n$ from the address buffer circuit 1 and converts the address signal into an internal address signal of $IA_0$ to $IA_n$. The internal address signal of $IA_0$ to $IA_n$ is supplied to the address decoder 2. The empty address detecting circuit 5 receives the two most significant bits, namely $IA_{n-1}$ and $IA_n$, of the internal address signal of $IA_0$ to $IA_n$. The empty address detecting circuit 5 generates a detection signal which becomes active when the two most significant bits $IA_{n-1}$ and $IA_n$ of the internal address signal are both '1' (i.e. high level).

The top address storing circuit 9 stores a top address signal of $TA_0$ to $TA_n$. The top address signal is a signal representing an offset from the address 0, and is used for changing the position of an empty address in the address space. The top address signal is a signal specifying one of the addresses from 0 to $2^{n+1}-1-(2^n+m)$. The top address signal is supplied to the address converting circuit 8. The top address storing circuit 9 may include a memory such as an EPROM, PLA (Programmable Logic Array), etc. having a storage capacity of n+1 bits.

Figure 8:
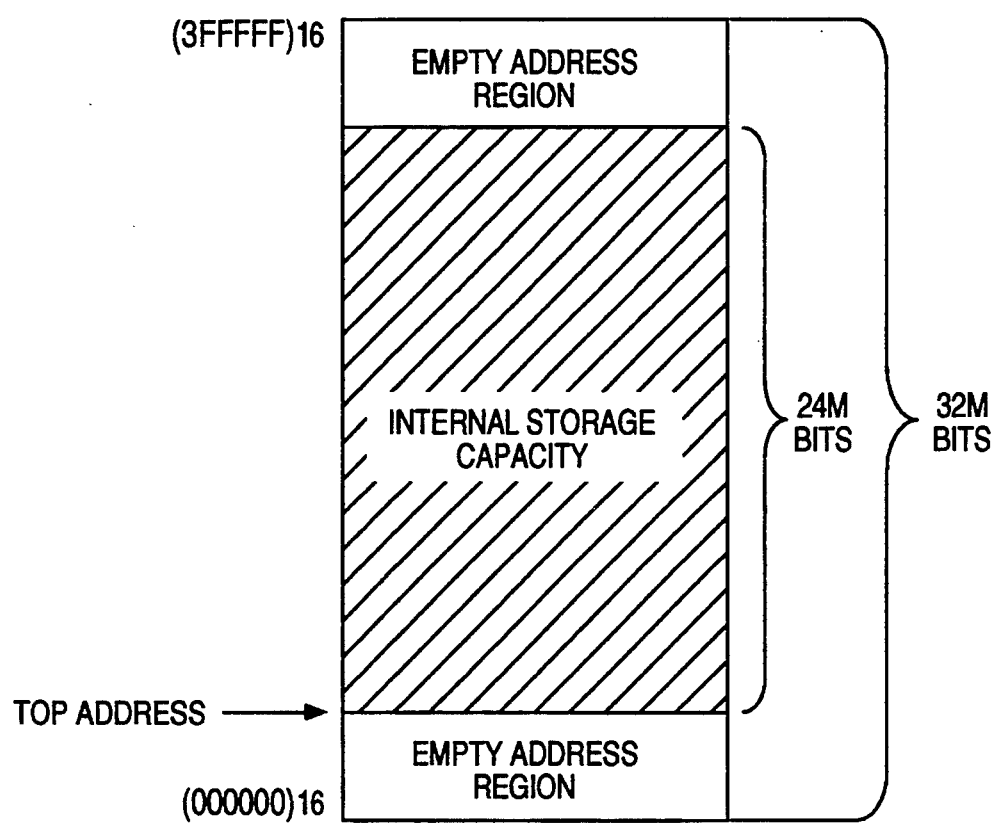
FIG. 8 is a diagram showing an arrangement of the address space of the semiconductor memory device according to a fourth example of the present invention.

The address converting circuit 8 generates the internal address signal of $IA_0$ to $IA_n$ by subtracting the address specified by the top address signal of $TA_0$ to $TA_n$ from the address specified by the address signal of $A_0$ to $A_n$ provided by the address buffer circuit 1. Accordingly, the semiconductor memory device according to the present example accesses the memory cell array 3 at an address which is offset from the address specified by the input address signal of $A_0$ to $A_n$ by the value (addresses) specified by the top address signal of $TA_0$ to $TA_n$. This makes it possible to make it seem as if a sub-address space of 24M bits among the entire address space of 32M bits corresponds to the actual storage capacity, starting from the top address (i.e. the address specified by the top address signal of $TA_0$ to $TA_n$) and as if empty address regions are present before and after the 24M bit region, as is shown in FIG. 8.

Hereinafter, the conversion of the address signal of $A_0$ to $A_n$ into the internal address signal of $IA_0$ to $IA_n$ by the address converting circuit 8 will be described in more detail.

The top address signal of $TA_0$ to $TA_n$ is stored in the top address storing circuit 9. The stored top address signal is expressed by the binary system and as a two's complement.

Figure 9:
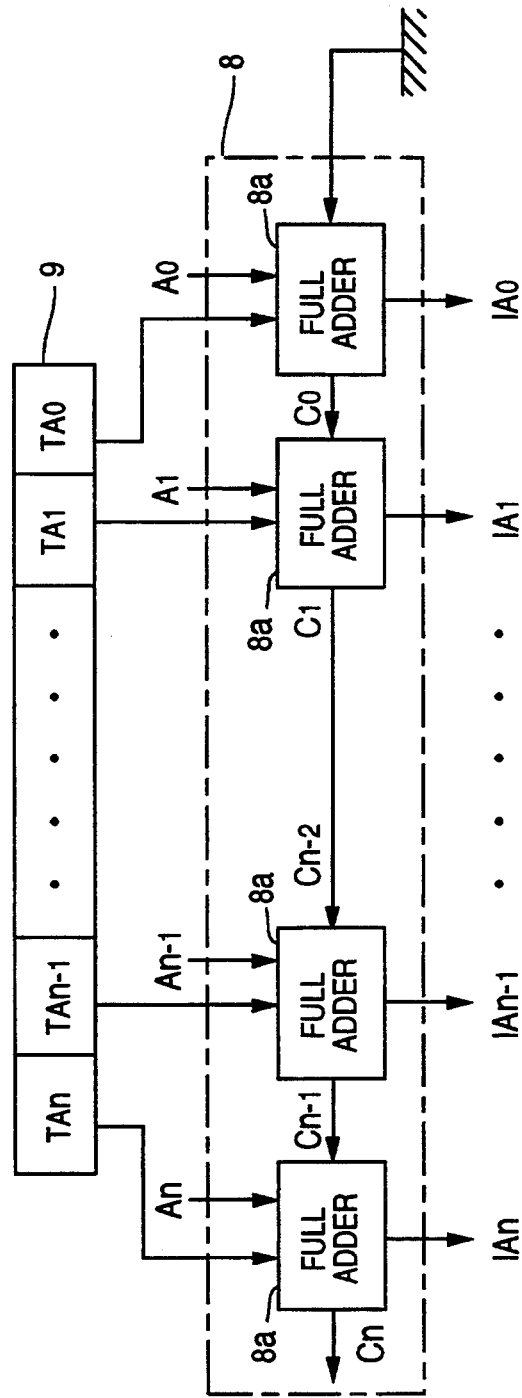
FIG. 9 is a block diagram showing a configuration for an address converting circuit.
Figure 10:
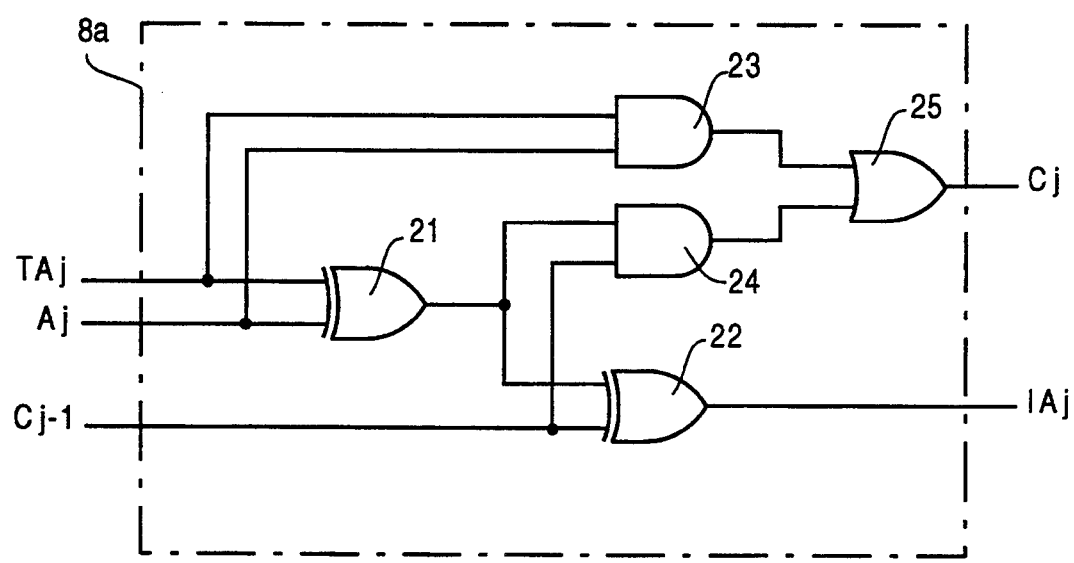
FIG. 10 is a block diagram showing a configuration for a full adder.

FIG. 9 shows a configuration for the address converting circuit 8. The address converting circuit 8 includes n+1 full adders 8a. As is shown in FIG. 10, each full adder 8a includes two exclusive OR circuits 21 and 22, two AND circuits 23 and 24, and one OR circuit 25. Each full adder 8a receives a bit $A_j$ representing a jth digit (bit) of the address signal $A_0$ to $A_n$, a bit $TA_j$ representing a jth digit (bit) of the top address signal $TA_0$ to $TA_n$, and a carry bit $C_{j-1}$ from a (j−1)th digit (bit). Then, each full adder 8a outputs an address signal $IA_j$ which represents the added result of the bit $A_j$ and the bit $TA_j$, and a carry bit $C_j$ of the jth digit (bit).

Thus, the address specified by the two's complement of the top address signal of $TA_0$ to $TA_n$ is added to the address specified by the address signal of $A_0$ to $A_n$ so as to obtain a difference therebetween. Any carry bit $C_n$ in the full adders 8a that corresponds to the MSB (Most Significant Bit) is ignored.

Figure 11:
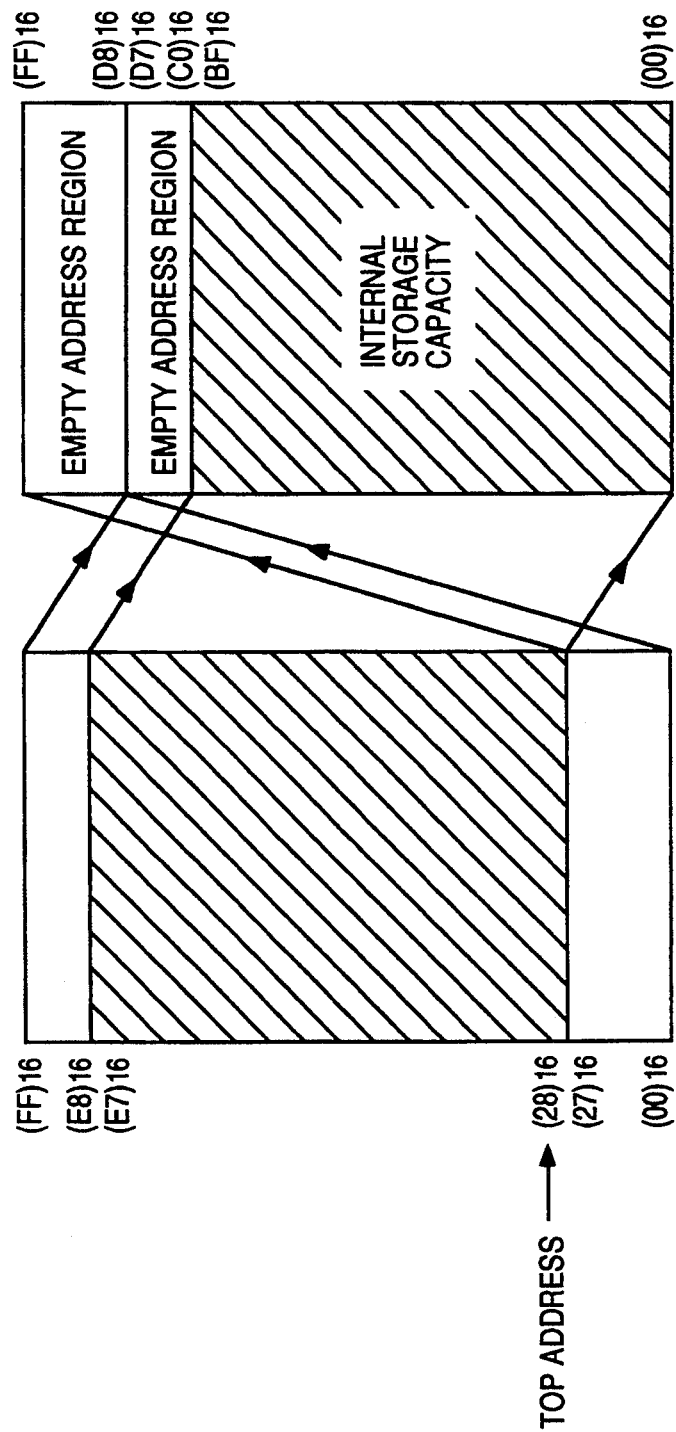
FIG. 11 is a memory map showing an exemplary calculation of the address converting circuit.
Figure 12:
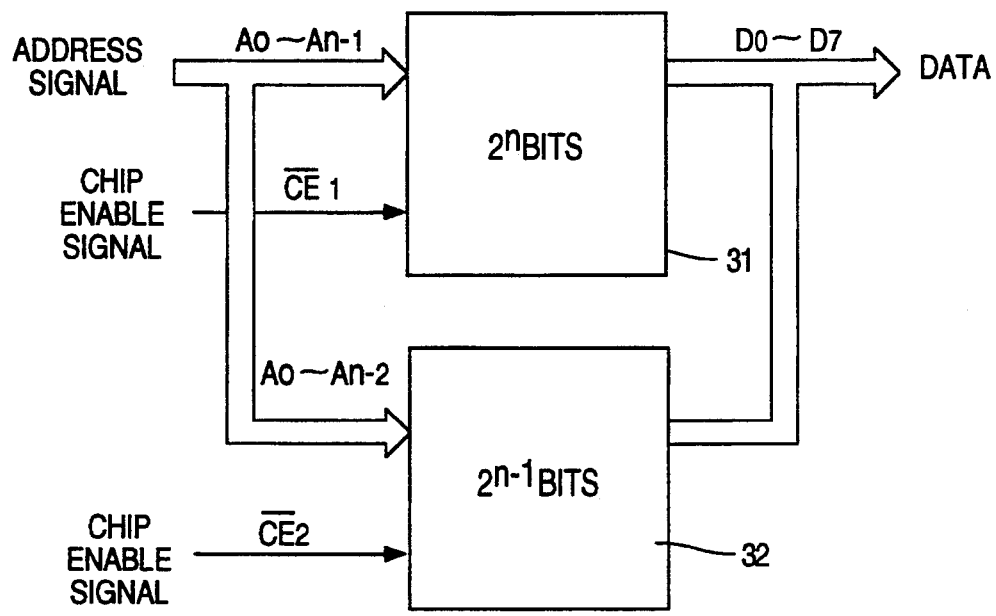
FIG. 12 is a block diagram showing a configuration for a conventional semiconductor memory device.
Figure 13:
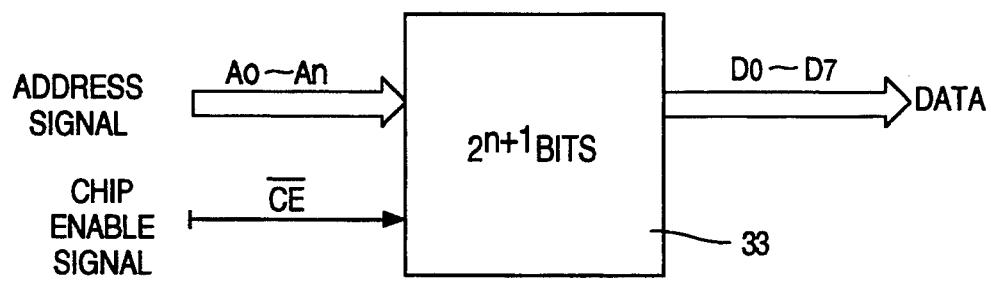
FIG. 13 is a block diagram showing another configuration for a conventional semiconductor memory device.

FIG. 11 shows an exemplary calculation by the address converting circuit 8. Herein, it is assumed for conciseness that the address signal consists of 8 bits. In this case, the address signal of $A_0$ to $A_7$ specifies one of addresses from $(00)_{16}$ to $(FF)_{16}$, as expressed by the hexadecimal system. It is also assumed that the memory cells of the memory cell array 3 are provided so as to correspond to the respective addresses from $(00)_{16}$ to $(BF)_{16}$ as specified by the internal address signal of $IA_0$ to $IA_n$. It is further assumed that the address $(28)_{16}$ is the top address. Since $(28)_{16}$ is expressed as $(00101000)_2$ by the binary system, and the two's complement thereof is $(11011000)_2$, the value $(11011000)_2$ is stored as the top address in the top address storing circuit 9.

If the address signal of $A_0$ to $A_n$ specifies the address $(28)_{16}$, i.e. the top address, then the internal address signal of $IA_0$ to $IA_n$ specifies the address $(00)_{16}$, which corresponds to the first memory cell. If the address signal of $A_0$ to $A_n$ specifies the address $(E7)_{16}$, then the internal address signal of $IA_0$ to $IA_n$ specifies the address $(BF)_{16}$, which corresponds to the last memory cell. If the address signal of $A_0$ to $A_n$ specifies any of the addresses from $(E8)_{16}$ to $(FF)_{16}$, then the internal address signal of $IA_0$ to $IA_n$ specifies the corresponding one of the addresses from $(C0)_{16}$ to $(D7)_{16}$. Since the addresses from $(C0)_{16}$ to $(D7)_{16}$ are empty addresses, no memory cells correspond to those addresses. Similarly, if the address signal of $A_0$ to $A_n$ specifies any of the addresses from $(00)_{16}$ to $(27)_{16}$, then the internal address signal of $IA_0$ to $IA_n$ specifies the corresponding one of the addresses from $(D8)_{16}$ to $(FF)_{16}$. Since the addresses from $(D8)_{16}$ to $(FF)_{16}$ are empty addresses, no memory cells correspond to those addresses.

As has been described, according to the semiconductor memory device of the fourth example of the invention, any continuous region in the address space can be made to correspond to memory cells by converting the input address signal of $A_0$ to $A_n$ into the internal address signal of $IA_0$ to $IA_n$ with the use of the address converting circuit 8. In other words, the arrangement of empty addresses in the address space can be changed. This makes it possible to design a memory system including a semiconductor memory device with an increased degree of freedom.

It will be apparent to those skilled in the art that the address converting circuit 8 and the top address storing circuit 9 shown in FIG. 7 are applicable to the semiconductor memory devices according to the second and third examples of the invention.

EXAMPLE 5

Figure 14:
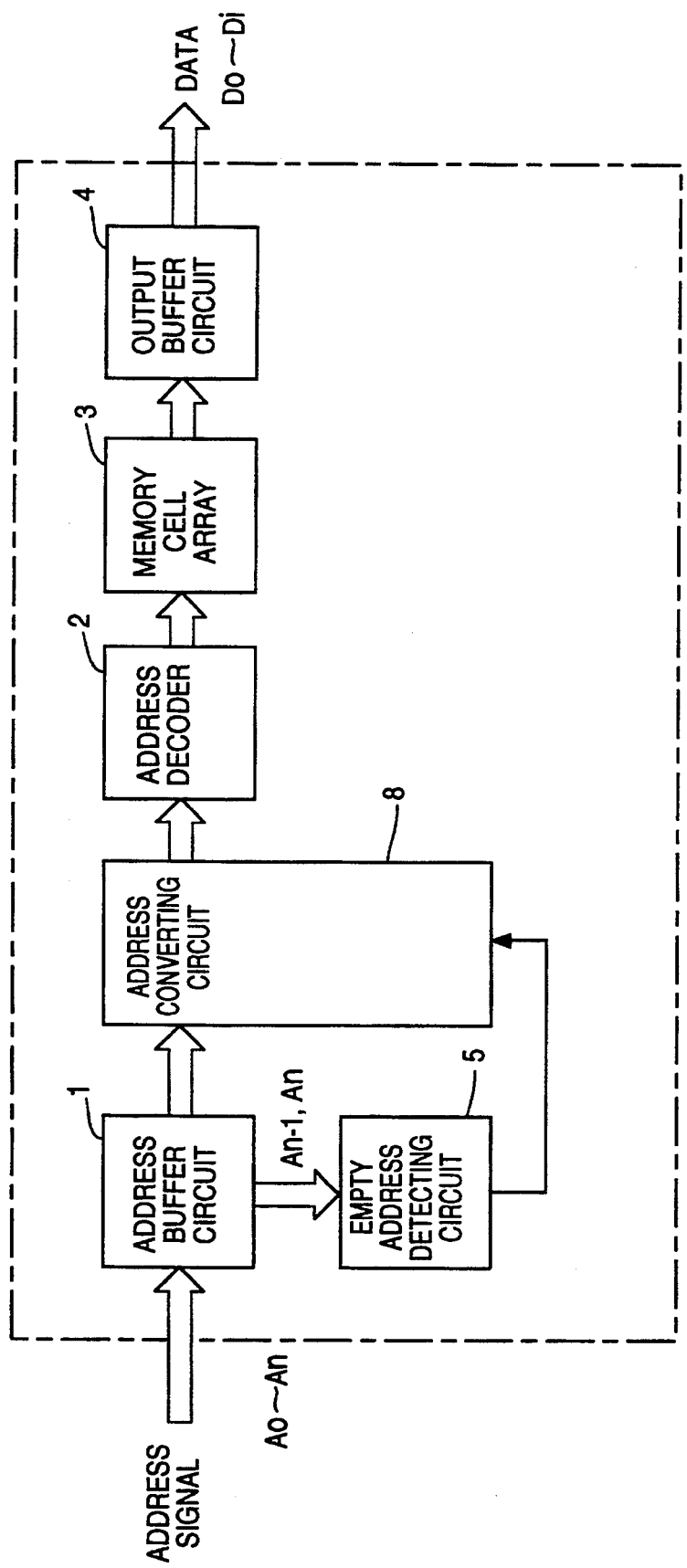
FIG. 14 is a block diagram showing a configuration for a semiconductor memory device according to a fifth example of the present invention.

FIG. 14 shows a configuration for a semiconductor memory device according to a fifth example of the present invention. Component elements having similar functions to the component elements of the semiconductor memory device of the first example (shown in FIG. 1) are indicated by the same reference numerals, and descriptions thereof are omitted.

The semiconductor memory device shown in FIG. 14 includes an address converting circuit 8, in addition to an address buffer circuit 1, an address decoder 2, a memory cell array 3, an output buffer circuit 4, and an empty address detecting circuit 5.

The empty address detecting circuit 5 receives at least the two most significant bits, i.e. $A_{n-1}$ and $A_n$, of an address signal of $A_0$ to $A_n$, and generates a detection signal indicating whether the address signal specifies an empty address or not. For example, the empty address detecting circuit 5 generates a detection signal which becomes active when the two most significant bits $A_{n-1}$ and $A_n$ are both '1' (i.e. high level). In other words, the empty address detecting circuit 5 becomes active when the address signal specifies an empty address, and otherwise becomes inactive. This detection signal is supplied to the address converting circuit 8.

The address converting circuit 8 receives the address signal from the address buffer circuit 1, and receives the detection signal from the empty address detecting circuit 5. If the detection signal is active, the address converting circuit 8 converts the received address signal into an address specifying a desired non-empty address signal. The converted address signal is supplied to the address decoder 2. If the detection signal is inactive, the address converting circuit 8 may supply the received signal to the address decoder 2 as it is, i.e. without converting it to any other address signal. Alternatively, the address signal may be converted into a desired address signal.

Figure 15:
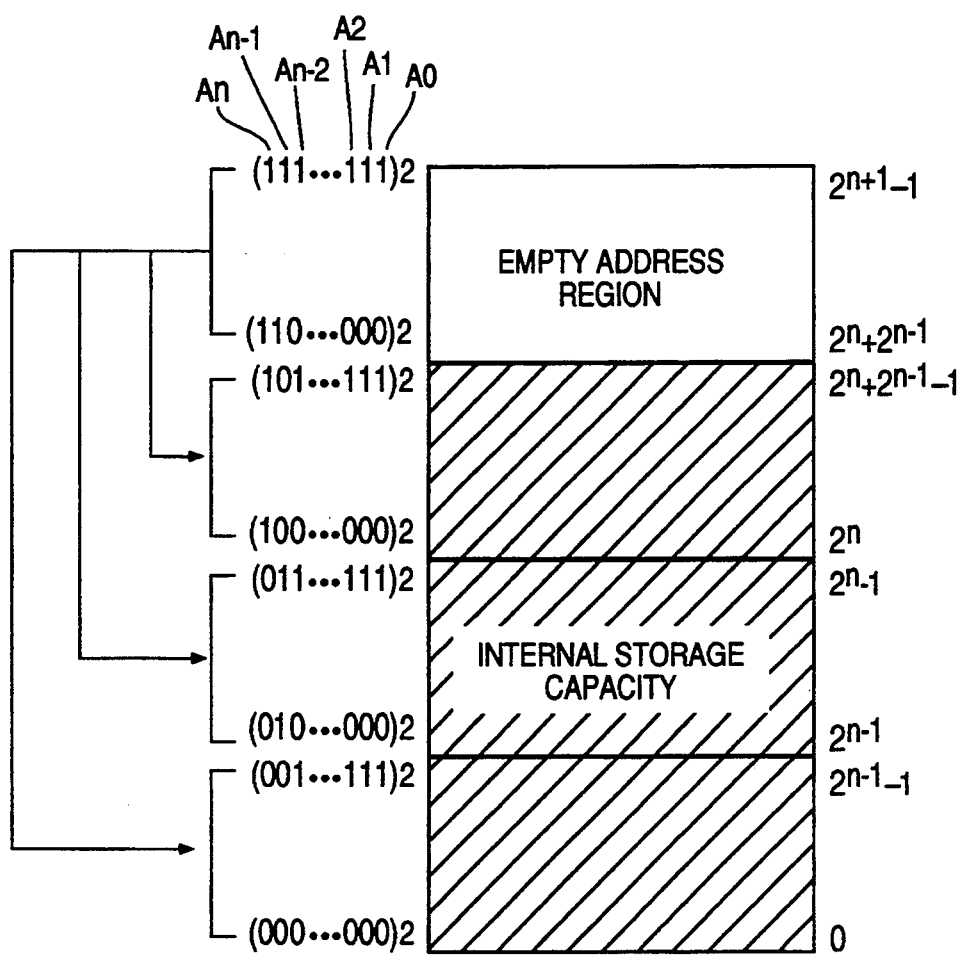
FIG. 15 is a diagram showing an arrangement of the address space of the semiconductor memory device according to a fifth example of the present invention.
Figure 16A:
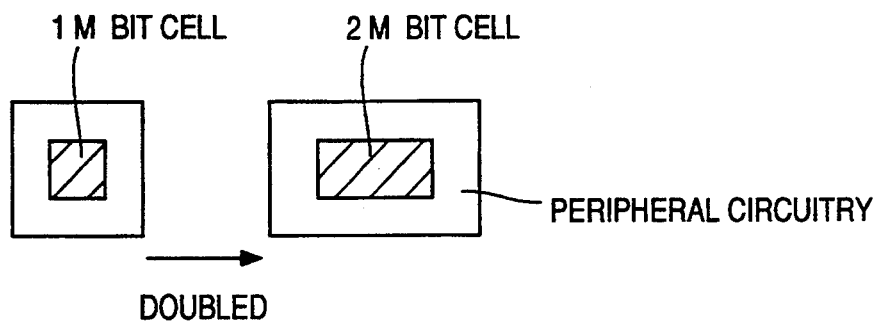
FIGS. 16A and 16B are views showing the sizes of memory chips.
Figure 16B:
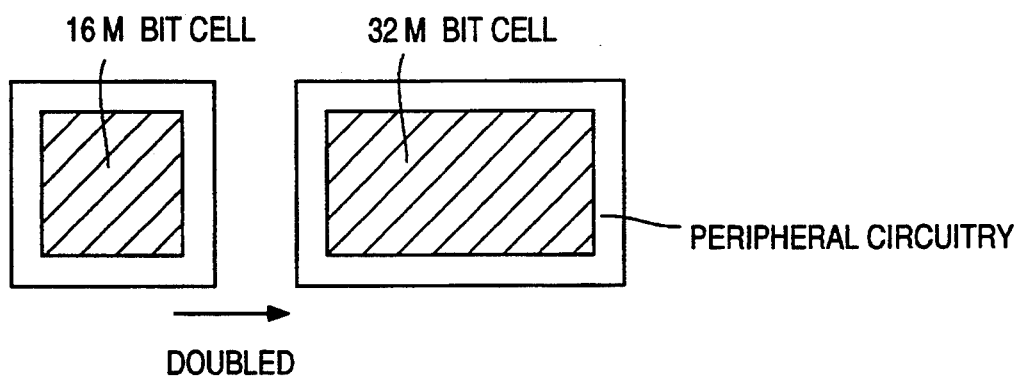
Figure 17:
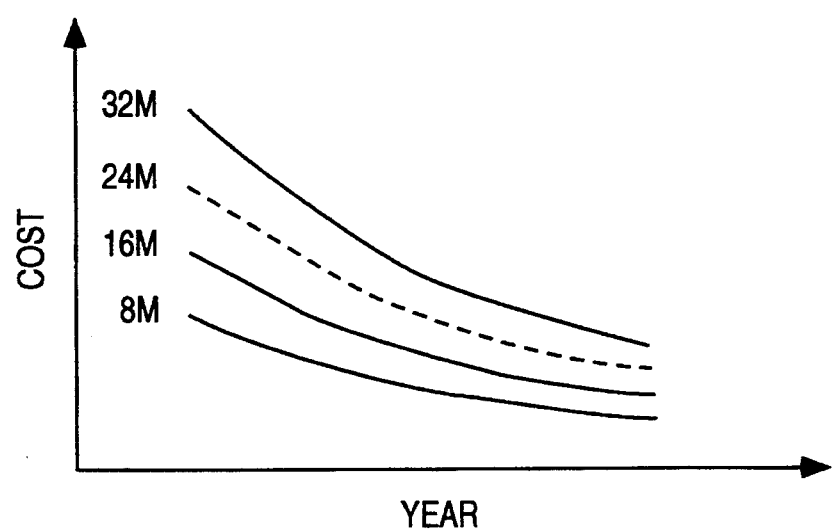
FIG. 17 is a graph showing yearly transitions of the cost of memories.

FIG. 15 shows an exemplary memory map in a case where a region of the address space in which the two most significant bits $A_{n-1}$ and $A_n$ of the address signal of (n+1) bits are both '1' (high level) is defined as an empty address region. In this example, one fourth of the entire address space that is accessible by the address signal of (n+1) bits is defined as an empty address region. The converting circuit 8 previously determines which portion of the hatched region having an internal memory capacity (shown in FIG. 15) should be assigned with the empty address. Accordingly, it is made possible to access the predetermined region of the address space even when the address signal specifies an empty address.

As has been described, according to the semiconductor memory device of the fifth example of the invention, the empty address region is associated with a portion of the internal address space, instead of conducting output control or stand-by control in accordance with the detection signal generated by the empty address detecting circuit. As a result, it is made possible to access the desired region of the address space even if the address signal specifies an empty address. Thus, the memory map in making a program for a system is simplified, thereby facilitating the making of the program. As a result, the system is prevented from having errors.

It will be apparent to those skilled in the art that the address converting circuit 8 shown in FIG. 14 is applicable to the semiconductor memory devices according to the second, third, and fourth examples of the invention.

As has been described, according to the present invention, it is possible to provide a semiconductor memory device having a storage capacity of $(2^n+m)$ bits. Therefore, the present invention is effective in cases where a storage capacity of $2^n$ bits is not enough but that of $2^{n+1}$ bits is too large. By thus optimizing the storage capacity of the semiconductor memory device, a low-cost semiconductor memory device with a relatively small power consumption can be provided. Moreover, the terminal arrangement of a semiconductor memory device according to the present invention can be made identical with that of a semiconductor memory device having a larger storage capacity. This makes it possible to easily expand the storage capacity of a memory system which includes a semiconductor memory device(s) by replacing the semiconductor memory device(s).

Moreover, according to the semiconductor memory device of the fourth example of the invention, any continuous region in the address space can be made to correspond to memory cells. In other words, the arrangement of empty addresses in the address space can be changed. Accordingly, it is made possible to design a memory system including a semiconductor memory device with an increased degree of freedom.

Moreover, according to the semiconductor memory device of the fifth example of the invention, it is possible to access the desired region of the address space even if the address signal specifies an empty address. Thus, the memory map in making a program for a system is simplified, thereby facilitating the making of the program. As a result, the system is prevented from having errors.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a memory cell array including $(2^n+m)$ memory cells, wherein n and m are integers satisfying the relationship $2^n<2^n+m<2^{n+1}$;
   decoding means for receiving an address signal of (n+1) bits and for specifying one of the $(2^n+m)$ memory cells in accordance with the address signal;
   output means for outputting data stored in the memory cell specified by the decoding means;
   empty address detecting means for receiving at least two bits of the address signal of (n+1) bits and for generating a detection signal which indicates whether the address signal represents an empty address or not; and
   control means for receiving an enable signal and for generating a control signal for outputting the data stored in the specified memory cell in accordance with the enable signal,
   wherein the control means further receives the detection signal and generates a control signal for inhibiting the data from being output when the address signal specifies an empty address, regardless of the state of the enable signal.

2. A semiconductor memory device according to claim 1, wherein a terminal arrangement of the semiconductor memory device is substantially identical with that of a semiconductor memory device having an address space of $2^{n+1}$ bits.

3. A semiconductor memory device according to claim 1, wherein an internal state of the semiconductor memory device is in a stand-by state when the control signal is a signal for inhibiting the data from being output.

4. A semiconductor memory device according to claim 1, wherein the output means receives the control signal from the control means and places a terminal of the output means into a high-impedance state when the control signal is a signal for inhibiting the data from being output.

5. A semiconductor memory device comprising:
   a memory cell array including $(2^n+m)$ memory cells, wherein n and m are integers satisfying the relationship $2^n<2^n+m<2^{n+1}$;
   top address storing means for storing a top address signal of (n+1) bits;
   address converting means for receiving an address signal of (n+1) bits and the top address signal and for converting the address signal into an internal address signal of (n+1) bits in accordance with the top address signal;
   decoding means for receiving the internal address signal and for specifying one of the $(2^n+m)$ memory cells in accordance with the internal address signal;
   output means for outputting data stored in the memory cell specified by the decoding means;
   empty address detecting means for receiving at least two bits of the internal address signal of (n+1) bits and for generating a detection signal which indicates whether the address signal represents an empty address or not; and
   control means for receiving an enable signal and for generating a control signal for outputting the data stored in the specified memory cell in accordance with the enable signal,
   wherein the control means further receives the detection signal and generates a control signal for inhibiting the data from being output when the address signal specifies an empty address, regardless of the state of the enable signal.

6. A semiconductor memory device comprising:

a memory cell array including $(2^n+m)$ memory cells, wherein n and m are integers satisfying the relationship $2^n<2^n+m<2^{n+1}$;

address converting means for receiving an address signal of (n+1) bits and for outputting an address signal for accessing one of the $(2^n+m)$ memory cells in accordance with the address signal;

decoding means for receiving the address signal from the address converting means and for specifying one of the $(2^n+m)$ memory cells in accordance with the address signal;

output means for outputting data stored in the memory cell specified by the decoding means; and empty address detecting means for receiving at least two bits of the address signal of (n+1) bits and for generating a detection signal which indicates whether the address signal represents an empty address or not, wherein the address converting means converts the received address signal into an address signal for allowing access to one of the $(2^n+m)$ memory cells when the address signal represents an empty address.

* * * * *